US 008863058B2

(12) United States Patent  (10) Patent No.: US 8,863,058 B2
Nagrath et al.  (45) Date of Patent: Oct. 14, 2014

(54) CHARACTERIZATION BASED BUFFERING AND SIZING FOR SYSTEM PERFORMANCE OPTIMIZATION

(71) Applicant: Atrenta, Inc., San Jose, CA (US)

(72) Inventors: Anup Nagrath, U.P. (IN); Sanjiv Mathur, U.P. (IN)

(73) Assignee: Atrenta, Inc., San Jose, CA (US)

( * ) Notice: Subject to any disclaimer, the term of this patent is extended or adjusted under 35 U.S.C. 154(b) by 7 days.

(21) Appl. No.: 13/625,377

(22) Filed: Sep. 24, 2012

(65) Prior Publication Data

US 2014/0089879 A1  Mar. 27, 2014

(51) Int. Cl.
 *G06F 17/50* (2006.01)
(52) U.S. Cl.
 USPC .......................................................... 716/113
(58) Field of Classification Search
 CPC .................... G06F 2217/84; G06F 17/5031
 USPC ................................................ 716/113, 114
 See application file for complete search history.

(56) References Cited

U.S. PATENT DOCUMENTS

| 5,493,508 A | 2/1996 | Dangelo et al. |
| 5,526,277 A | 6/1996 | Dangelo et al. |
| 5,541,849 A | 7/1996 | Rostoker et al. |
| 5,544,066 A | 8/1996 | Rostoker et al. |
| 5,553,002 A | 9/1996 | Dangelo et al. |
| 5,557,531 A | 9/1996 | Rostoker et al. |
| 5,563,800 A * | 10/1996 | Matsumoto et al. .......... 716/102 |
| 5,572,436 A | 11/1996 | Dangelo et al. |
| 5,598,344 A | 1/1997 | Dangelo et al. |
| 5,870,308 A | 2/1999 | Dangelo et al. |
| 5,880,967 A * | 3/1999 | Jyu et al. .................. 716/113 |
| 5,880,971 A | 3/1999 | Dangelo et al. |
| 5,910,897 A | 6/1999 | Dangelo et al. |
| 6,145,117 A * | 11/2000 | Eng .............................. 716/105 |
| 6,216,252 B1 | 4/2001 | Dangelo et al. |
| 6,324,678 B1 | 11/2001 | Dangelo et al. |
| 6,523,156 B2 * | 2/2003 | Cirit ............................. 716/113 |
| 6,600,959 B1 | 7/2003 | Coulman et al. |
| 6,842,886 B2 * | 1/2005 | Arai et al. .................... 257/206 |
| 7,010,763 B2 | 3/2006 | Hathaway et al. |
| 7,089,521 B2 | 8/2006 | Kurzum et al. |
| 7,093,208 B2 | 8/2006 | Williams et al. |
| 7,216,320 B2 | 5/2007 | Chang et al. |
| 7,360,191 B2 | 4/2008 | Chang et al. |
| 7,539,968 B2 | 5/2009 | Charlebois et al. |
| 7,657,859 B2 | 2/2010 | Cohn et al. |
| 7,721,237 B2 | 5/2010 | Scheffer et al. |
| 7,886,253 B2 | 2/2011 | Charlebois et al. |
| 7,926,011 B1 | 4/2011 | Levitsky et al. |
| 7,992,122 B1 | 8/2011 | Burstein et al. |
| 7,996,812 B2 | 8/2011 | Kotecha et al. |
| 8,015,517 B1 | 9/2011 | Reis et al. |

(Continued)

*Primary Examiner* — Jack Chiang
*Assistant Examiner* — Brandon Bowers
(74) *Attorney, Agent, or Firm* — Sughrue Mion, PLLC

(57) ABSTRACT

A method for timing optimization of an integrated circuit design using a timing optimization system comprising loading an original delay value and an original gate configuration net-list for an original gate from a results database. A near optimum gate configuration is identified using near optimum gate configuration information stored in a delay characterization database for the original gate. A near optimum delay value and a near optimum gate configuration net-list of a near optimum gate configuration are loaded. A timing optimized gate configuration is provided from running an incremental static timing analysis of the near optimum gate configuration.

20 Claims, 4 Drawing Sheets

(56) References Cited

U.S. PATENT DOCUMENTS

| | | |
|---|---|---|
| 8,095,900 B2 | 1/2012 | Sircar et al. |
| 8,219,962 B1 | 7/2012 | Anderson |
| 2003/0188271 A1 | 10/2003 | Zhuang et al. |
| 2004/0230924 A1 | 11/2004 | Williams et al. |
| 2011/0271241 A1 | 11/2011 | Krishnamoorthy et al. |
| 2012/0110541 A1 | 5/2012 | Ge et al. |
| 2012/0137263 A1 | 5/2012 | Dai et al. |

* cited by examiner

CHARACTERIZATION BASED BUFFERING AND SIZING FOR SYSTEM PERFORMANCE OPTIMIZATION

TECHNICAL FIELD

The current application relates to optimization of integrated circuit (IC) designs and specifically to use of pre-stored delay, with fall and rise time data of gates to reduce the iteration number and time taken by design optimization programs, and further specifically to obtain optimization during static timing analysis and closure.

BACKGROUND

Design optimization is an important component of design using electronic design automation (EDA) tools. The design optimization process helps optimize various characteristics of the design, such as speed of operation, power usage etc. Timing analysis, optimization and closure is one of the needed optimizations. Timing optimization is a very time consuming and iterative process that evaluates the performance of each gate used in a design, to ensure that the delay through the gate with the fan-in and fan-out loading is optimum. This process requires the gate to be modeled with and without buffering or by addition of multiple levels of inverters that enable the gate to function with the optimum rise and fall times for the switching signals, while providing an optimum delay through the integrated gate.

The existing timing optimization processes are iterative in nature and run various buffering and sizing transforms to converge to a final optimized delay values (DV) for the gate. The delay values comprise at least the gate delay and rise and fall times, for each loaded gate. The DV can also be represented by a slack value or slack number which are used interchangeably to specify the same set of gate characteristics. FIG. 1 show block diagrams of gate configurations 110, 120 and 130 that are used in a design to achieve speed and need to be analyzed to achieve the optimum DV for various gate loads. The gate configuration 110 shows a gate 101 with a load 105 and no buffering, gate configuration 120 shows a gate 101 that includes a buffer tree 121 of one or more buffers, as part of the gate configuration 120 to increase the gate drive to load 105, and gate configuration 130 shows a gate 101 with multiple inverters 131 and 132 that form a part of the gate configuration 130 providing drive to the load 105. The load 105 can comprise connected load from one or more driven gates. The static timing analysis (STA) timing analysis is used to arrive at the best gate configuration and sizes of the gate 101, the buffer 121 and inverters 131 and 132 to be used, to achieve the optimum delay performance of the configured gate. This is done by an iterative process for all the gates in the critical path of a design at least, if not for all the gates of the design from a starting configuration and sizing provided mainly based on the designers experience and intuition. Hence this is a very time consuming and resource intensive process.

FIG. 2 is a block diagram 200 showing the prior art system for implementation of the iterative process of STA for achieving the timing optimization. Each incremental change of buffer or sizing of the gate configuration components require the extraction of a new net-list and a new incremental STA run to arrive at the new DV for the gate. The flowchart 200 for the process operates as described herein below:

The design net-list is input into the EDA system for STA for design timing optimization (DTO). S201.

The initial STA is conducted on the design with the design net-list provided. S202.

The result for the initial gate configuration and initial values of DV, for each gate in the design are extracted. S203.

For each gate the extracted initial run values, the sizes, the associated gate configurations and net-list are stored in a database S220.

For the first gate to be optimized the initial values are loaded into the timing optimization system (TOS), which is typically an EDA system, from the database. S204.

The buffering and sizing changes are made by adding a buffer or inverter or increasing the sizes of devices to improve drive. The incremental changes are made based on the initial sizing and buffering of the gates done intuitively by the designer. S205.

A design net-list is generated for the design with the new gate configuration including new buffering and sizing. S206.

An incremental STA is run to assess the impact of the gate configuration changes. S207.

The DV for the gate are calculated from the result of the run. S208.

The resulting DV is compared with the stored DV for the gate. S209.

If the resulting DV is better than the stored DV, the gate related information in the database is updated with the new gate information comprising the new gate configuration, and associated DV. The gate optimization process is repeated from step S205 by changing the buffering and sizing of the gate configuration and extraction of net-list. S210.

If the result, of iteration, is not better indicating that the gate is closer to optimization, the two gate configurations are checked to see if the gate configuration in the database is checked for all types of buffering configurations allowed. S211. If not then the optimization process is repeated from step S205 by changing the buffering and sizing of the gate configuration until all configuration types are checked.

If the gate timing is optimized then the gate is checked to see if it is the last gate to be timing optimized. S212.

If it is not, then the system is instructed to load the next gate configuration (net-list) from the database and continue the optimization process from step S204, for the next gate to be timing optimized. S213

If the gate is the last gate to be optimized, the gate optimization process is complete with the optimized gate configuration net-list and DV for all gate configurations stored in the database. The full design STA is done with the gate net-list replaced in the design to optimize the design with actual fan-outs and loads and the DTO is stopped. S214.

As is clear from the flowchart 200 description for DTO, there are a large number of iterative steps which are time consuming and are resource intensive, such as net-list generation and running the incremental STA to generate the gate delay and the signal rise and fall times for each gate in the design. Typically the optimization process takes over 10 to 20 iterations for each gate to achieve convergence Fig. to S205 to S211, since all the buffering and sizing has to be done incrementally from the original value to get to the optimized values. A person of ordinary skill in the art would readily appreciate that as the scale of integrated circuits (ICs) increases in number, i.e., hundreds of millions of gates realized, the number of iterations grows at least linearly. It will be therefore advantageous if a method can be realized that reduces the number of iterations with the time taken and uses less EDA resources to achieve DTO.

SUMMARY

A method for timing optimization of an integrated circuit design using a timing optimization system is provided.

According to an exemplary embodiment, the method comprises: loading an original delay value and an original gate configuration net-list for an original gate from a results database; identifying a near optimum gate configuration using near optimum gate configuration information stored in a delay characterization database for the original gate; loading a near optimum delay value and a near optimum gate configuration net-list of a near optimum gate configuration; and producing a timing optimized gate configuration from running an incremental static timing analysis of the near optimum gate configuration.

The delay characterization database is generated by: defining and identifying gates, saving the identified gates in a local storage, loading a gate from the plurality of identified gates, running a timing simulation to characterize a delay value for the gate with a minimum load, extracting the near optimal delay value and a near optimal rise and a near optimal fall time, saving the extracted near optimum gate configuration in the delay characterization database, and loading another gate from the plurality of identified gates and repeating the process.

In the exemplary embodiment, prior to loading the original gate, the method comprises: retrieving the delay characterization database for a gate library in a process technology node; retrieving an integrated circuit design net-list; running a static timing analysis of the integrated circuit design net-list; extracting the original delay value for at least one gate configuration from the result of the static timing analysis of the integrated circuit design net-list; and storing the original delay value, the original gate load information, and the original gate configuration net-list in the results database for the at least one gate.

After producing the timing optimized gate configuration, the method comprises: calculating the resultant timing optimized delay value for the timing optimized gate configuration; comparing the timing optimized delay value with the original delay value; saving the timing optimized gate configuration net-lists and the timing optimized gate configuration delays in the result database; replacing the original gate with the timing optimized gate configuration in the result database; and initiate the process for another original gate.

In an exemplary embodiment, the delay characterization database comprises information on the near optimum delay value, a signal rise time, and a signal fall time for at least one of the near optimum gate configuration.

Further, in another exemplary embodiment, at least one of the near optimum gate configuration comprises a net-list with and without all available buffer combinations, and/or may comprise a net-list with and without all available inverter combinations.

In another exemplary embodiment, retrieving the integrated circuit design net-list comprises of at least two or more gates. Further, performing incremental static timing analysis of gate configurations comprises inputting: the near optimum gate delay, a signal rise time, a signal fall time, and the associated near optimum gate configuration net-list from the delay characterization database.

Further, the associated near optimum gate configuration net-list from the delay characterization database occurs without generation of a new net-list for each such gate configuration input at each iteration.

An exemplary system is provided to implement the above method. Furthermore, a non-transitory computer-readable storage medium is also provided with instructions for implementing the above exemplary method

DETAILED DESCRIPTION

Optimization of designed integrated circuit or system on chip (SOC) performance is done by reducing timing delay through gates and improving the signal rise and fall times of gates. Static timing analysis (STA) provides for the optimization of gate delays by adding buffers and inverters to the gate circuit where needed. They are sized, interactively, to handle the required fan-out and to improve the signal rise and fall times by changing the gate drive, which is a very time consuming process. Therefore reducing the number of iterations required during optimization of design is imperative. Accordingly all the various gate sizes, with and without different buffer and inverter sizes, are evaluated for delay, rise and fall times. The results are stored in a delay characterization database, during technology compilation and review. Information from this database is used during an incremental STA process to simplify and reduce the iterative process of design timing optimization.

A computer program product is provided that contains a plurality of instructions embedded in a non-transitory computer readable medium. The program product when executed by a system, such as an electronic design automation (EDA) system, having computing devices therein, causes the computing device to execute a method for generation of delay information of all usable gate configurations and fan-outs acceptable loads, for a technology node and store the same in a design characterization database (DCDB). The gate configurations, device sizes and gate loads are limited only by the technology and process constraints at the technology node. The stored information in the DCDB is used by a computer system for timing optimization running the EDA program during design timing optimization. The gate configuration and delay timings are input into the system during the gate optimization using incremental STA. This enables a virtual optimization of the gates used without going into net-list creation at each gate configuration change. Since there is a signal delay, the rise and fall times are available in the DCDB, which enables pre-screening of buffering and sizing for optimization, thereby reducing the number of iterations needed to arrive at the optimum buffering and sizing for the gate. A final set of STA runs for the design starting with the virtually optimized gates enable the final design optimization iterative cycles to be reduced to a minimum number, saving time and EDA resources. The details of the design optimization using stored information in the DCDB are described in detail below.

Figure 1:
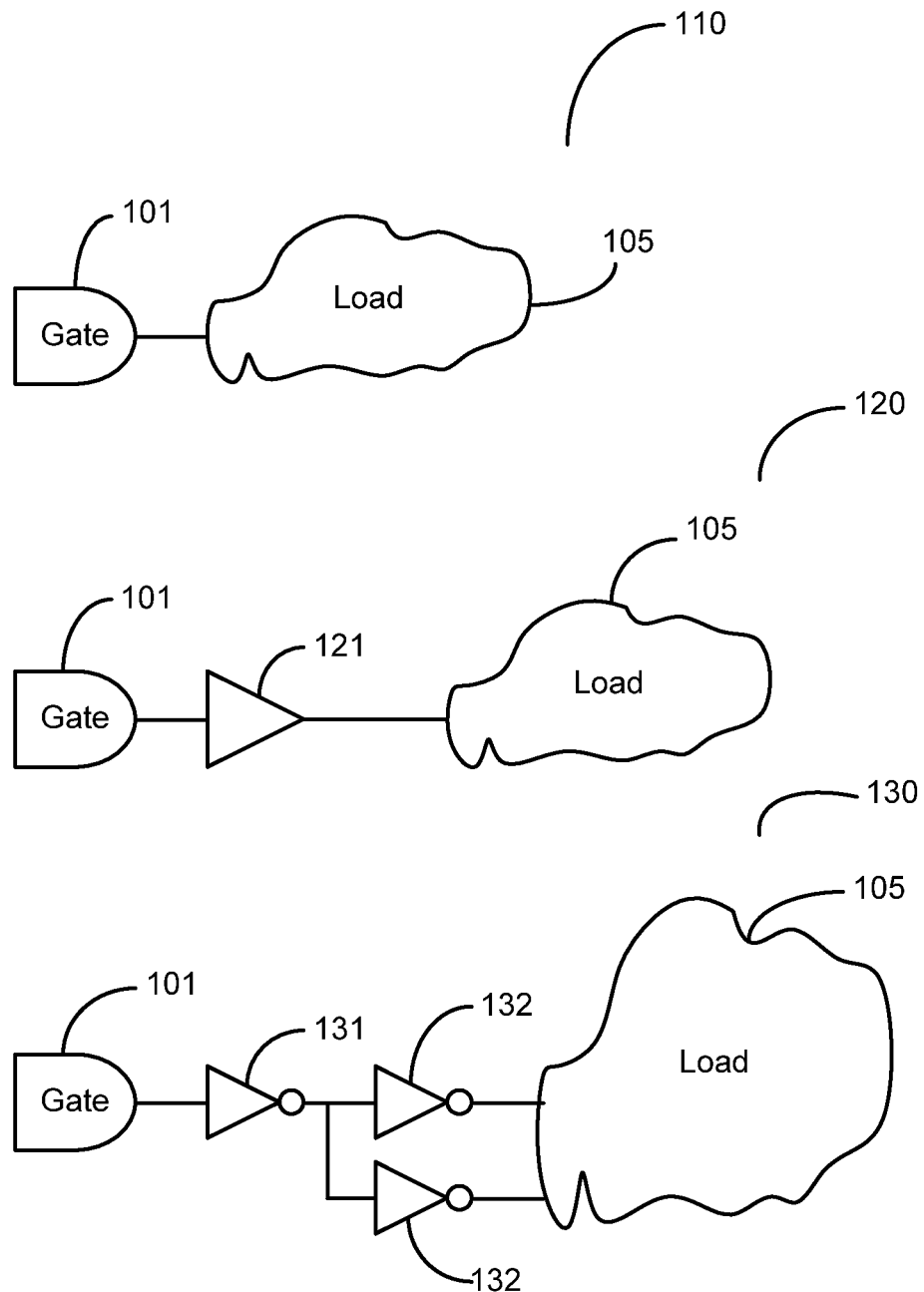
FIG. 1—is an exemplary and non-limiting block diagram of different ideal gate configurations used in designs. (Prior Art).
Figure 2:
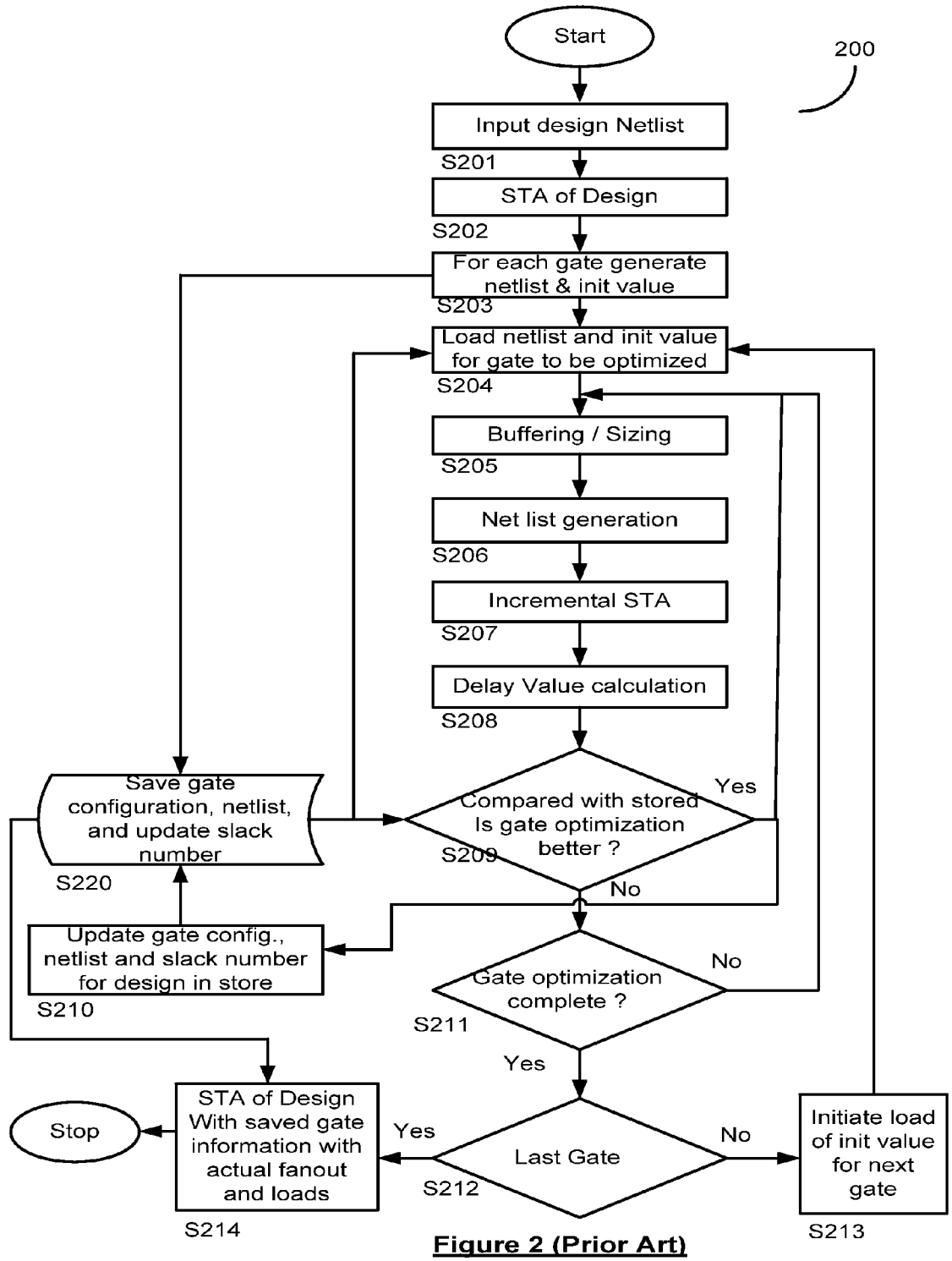
FIG. 2—is an exemplary and non-limiting flow chart of gate level optimization by static timing analysis. (Prior Art).
Figure 3:
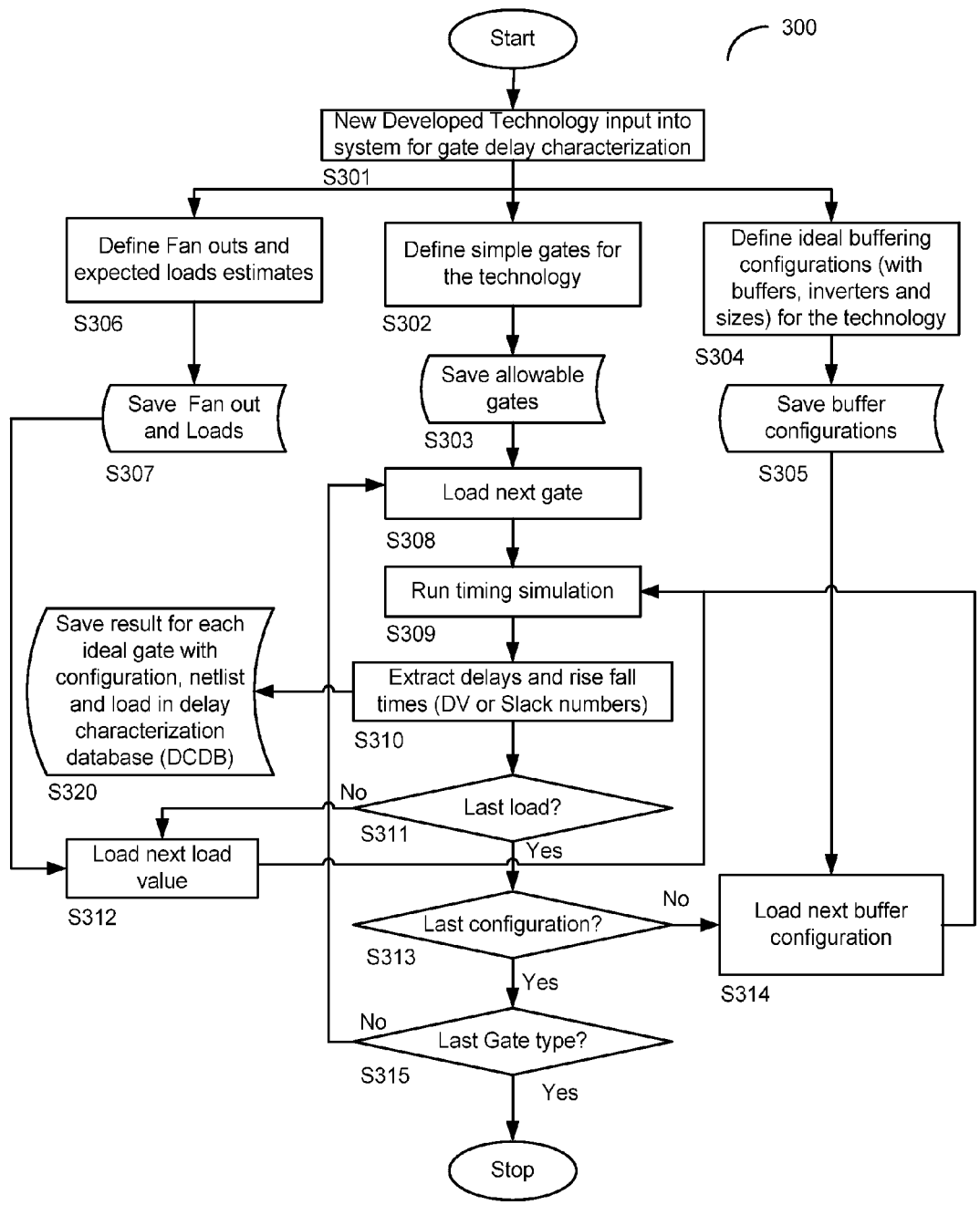
FIG. 3—is an exemplary and non-limiting flowchart of extraction of gate level DV, for all acceptable loads for all acceptable gate configurations in a library of gates in a process technology node (library-technology), for generation of a delay characterization database.

FIG. 3 is an exemplary and non-limiting flowchart 300 of the development of a library-technology level characterization delay database (DCDB) for a gate library in a delay characterization system (DCS). This is done by extraction of the gate configurations, net-lists, delay times, rise and fall times for all possible target load and fan-outs for a library of gates in a process technology node (library-technology). This is done when the technology is developed, characterized and evaluated. The exemplary flow is as described below:

The gate library in the process technology node (library-technology) is input to do the computer based gate delay characterization system (DCS). S301.

The simple gate design and sizes to be used in a design at the technology node are all identified for characterization. S302.

The identified simple gates that comprise the sized gate net-lists, are saved in a local storage for analysis. S303

The different buffering and inverter chains or tree configurations and their allowed sizes are defined and entered for generating all allowable gate configurations for the library-technology. S304

The net-list of defined buffers, inverters and their sizing are saved for analysis. S305

The gate fan-outs and drive requirements for the ideal loading expected on the gates for the allowable gate configurations, (comprising simple gates with and without buffers and inverters), are identified for characterization of the various gate configurations. S306.

The identified gate load information is stored for analysis. S307.

Load a first gate (net-list) into the simulator for characterization and delay analysis. S308.

Run the simulation to characterize the DV for the gate configuration with minimum load. S309.

For the gate configuration net-list, the DV and the ideal load value for the gate configuration with the load are extracted. S310.

The extracted DV and the gate configuration information, including the gate load information, are saved in a delay characterization database (DCDB). S320.

Check if all the approved load values for the gate have been connected and checked. S311.

If not the next allowable load value is connected to the output of the gate configuration being simulated. S312. The simulation, DV extraction and result storage from step S309 to step S320 are repeated for all allowed loads for the gate configuration.

If all the allowed loads have been completed then the saved gate configurations are checked to see if they have all been completed. S313.

If not the next buffer configuration is loaded into the simulator. S314. The simulations are repeated for each such gate configuration with allowable loads from step S309 to extract the DV and saved with gate configuration net-list and gate load values, in the DCDB.

If all the buffer configurations for the gate are complete then the saved allowable gates are checked to see if all of the gates have been completed. S315.

If not then the next gate is loaded. S308. The simulations are repeated from step 309 to save DVs of all allowable gate configurations with all allowed loads and associated gate configuration net-lists in the DCDB.

If all saved simple gates have been analyzed then the DCDB contains the needed delay values (DV) and gate configuration information for use in the design optimization runs and the flow is completed for the library-technology.

The DCDB now comprises the library-technology of all allowable gate configurations, with their net-lists and DV information, for all allowed load combinations for a specific technology. These are now usable for any optimization simulations for designs using the technology.

Figure 4:
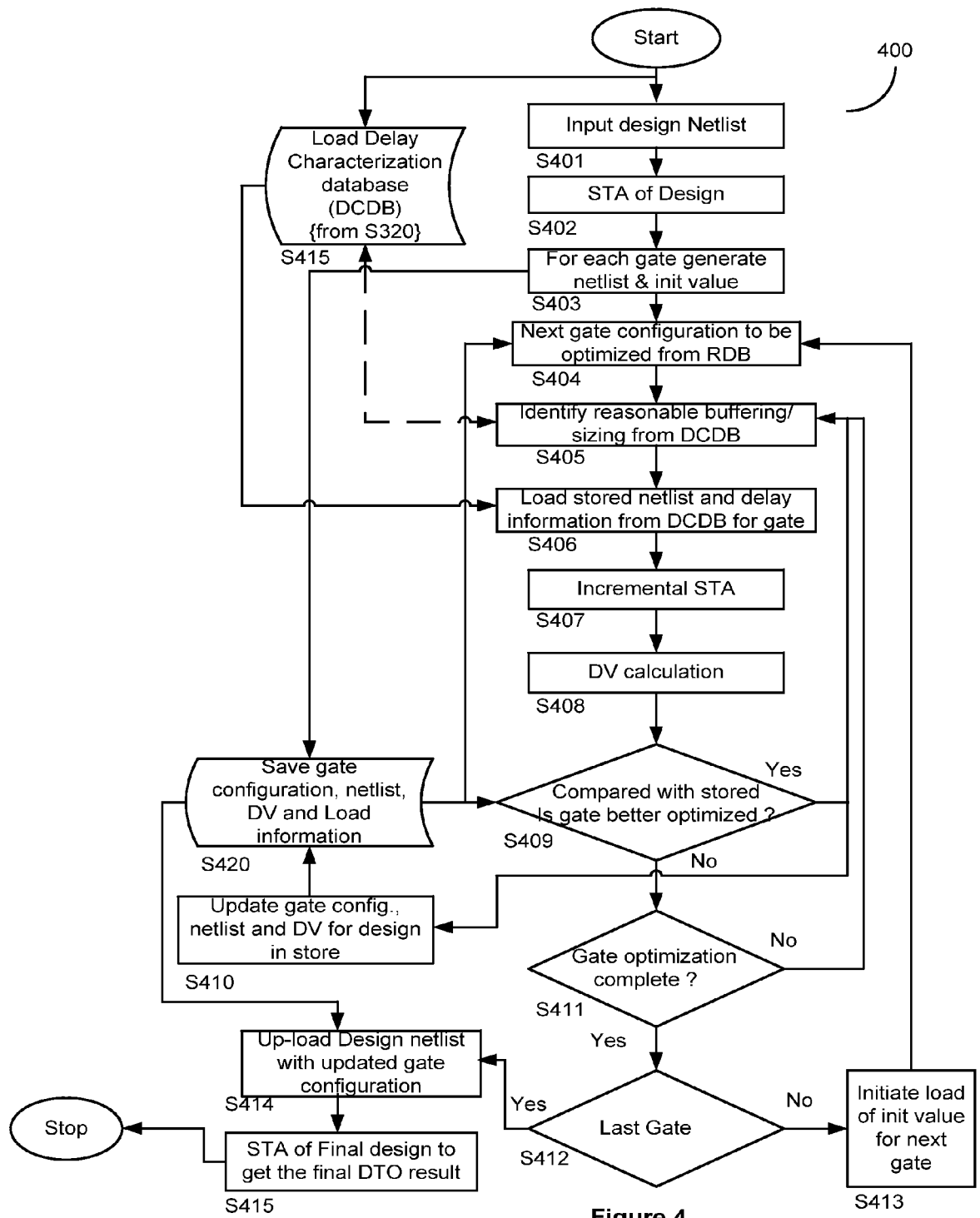
FIG. 4—is an exemplary and non-limiting flowchart of the design timing optimization process in a timing optimization system (TOS) using the delay characterization database (DCDB).

FIG. 4 is an exemplary and non-limiting flowchart 400 of the design timing optimization process using the delay characterization database generated at S320 in a design timing optimization system (TOS) such as an EDA TOS.

The DCDB is loaded into the storage unit of a TOS, such as an EDA system, for use with the EDA software for DTO of designs using the specified technology for which the DCDB has been generated. S415.

The design net-list for the design whose timing is to be optimized is loaded into the EDA tool. S401.

The STA of the design is run generating the timing of the input design net-list. S402.

For each gate configuration of the design the DV is extracted from the STA result. S403.

The DVs are saved in a result database (RDB) with available gate load information and the associated gate configuration net-lists. S420.

Load from the RDB the DV and net-list of the gate configuration to be optimized. S404.

Using the gate configuration information stored in the DCDB identify the near optimum gate configuration for the loaded gate. S405.

This step is different from the previous methods of optimization in that the TOS is able to choose a close to optimum, but ideal gate configuration as a first approximation. This reduces the number of iterations needed to achieve optimization.

The net-list and DV information are loaded into the TOS for the incremental STA from the DCDB. S406.

Incremental STA is run on the gate configuration with the gate load. S407.

The resultant DV is calculated for the new gate configuration. S408.

The new results are compared with those saved in the RDB. S409.

If the DV results are better than the DV information in the RDB then, the information for the gate configuration under optimization is replaced with the new information of the tested gate configuration. The gate configuration net-list and delay information are updated in the RDB. S410.

Further if the results are found to be better than those in the RDB, the next gate configuration is loaded into the system and the optimization process is repeated from S405 to S410.

If on comparison with the current results stored in the RDB the results of incremental STA are marginal or negative, then the gate configuration results in RDB is checked to see if there are other gate configurations that can be optimum for the design and gate loading. S411.

If there is a new gate configuration that can possibly provide better optimization, then that configuration net-list and delay information are loaded and the process is repeated from S405 to S410.

If there are no better optimization possibilities for the gate configuration, then a check is done to see if the gate configuration being checked is the last gate configuration. S412.

If it is not the last gate configuration then the next gate configuration loading from the RDB is initiated. S413. The optimization process is repeated for the next gate configuration from S404 to S412.

If the gate configuration being checked is the last gate configuration in the RDB, then the gate optimization process is complete. The design net-list with optimized gate configurations that are in the RDB is loaded back into the EDA based TOS. S414.

The full design STA is done with the original gate configuration net-list replaced in the design by the optimized gate configuration net-list, to optimize the design with actual fan-outs and loads. Once the optimized results of the STA are completed the DTO process is stopped. S415.

The new process of DTO reduces the iterations needed for the incremental STA optimizing individual gates from 10 to 20 to a value less than 5 by providing better first approximation for the incremental STA and better input approximations for the gate DV for subsequent iteration from the DCDB. It also eliminates the need for net-listing and delay calculations as these are available from the DCDB for the gate configurations used. This method of pre-characterizing the gate configurations, for a technology for use with DTO process in an EDA system during the design cycle, saves time and resource usage and accelerates the design process.

A person skilled-in-the-art would readily appreciate that the invention disclosed herein is described with respect to specific embodiments that are exemplary. However, this should not be considered a limitation on the scope of the invention. Specifically, other implementations of the disclosed invention are envisioned and hence the invention should not be considered to be limited, to the specific embodiments discussed herein above. The invention may be implemented on other computing capable systems and processors, or a combination of the above. The invention may also be implemented as a software program stored in a memory module, to be run on an embedded, standalone or distributed processor, or processing system. The invention may also be run on a processor, a combination of integrated software and hardware or as emulation on hardware. The invention should not be considered as being limited in scope based on specific implementation details, but should be considered on the basis of current and future envisioned implementation capabilities.

The invention claimed is:

1. A method for timing optimization of an integrated circuit design implemented using an electronic design automation processing system having at least a processor and a database storage, the method comprising:
    loading an original delay value and an original gate configuration net-list for an original gate from a results database;
    identifying an ideal gate configuration using gate configuration information stored in a delay characterization database for the original gate;
    loading an ideal delay value and an ideal gate configuration net-list of the ideal gate configuration; and
    producing a timing optimized gate configuration from running an incremental static timing analysis on the loaded gate configuration.

2. The method of claim 1, wherein the delay characterization database is generated by:
    defining and identifying gates, saving the identified gates in a local storage,
    loading a gate from the plurality of identified gates, running a timing simulation to characterize a delay value for the gate with a minimum load,
    extracting the ideal delay value and an ideal rise and an ideal fall time,
    saving the extracted ideal gate configuration in the delay characterization database, and
    loading another gate from the plurality of identified gates and repeating the process.

3. The method of claim 1, wherein prior to loading the original gate, the method comprises:
    retrieving the delay characterization database for a gate library in a process technology node;
    retrieving an integrated circuit design net-list;
    running a static timing analysis of the integrated circuit design net-list;
    extracting the original delay value for at least one gate configuration from the result of the static timing analysis of the integrated circuit design net-list; and
    storing the original delay value, the original gate load information, and the original gate configuration net-list in the results database for the at least one gate.

4. The method of claim 1, wherein after producing the timing optimized gate configuration, the method comprises:
    calculating the resultant timing optimized delay value for the timing optimized gate configuration;
    comparing the timing optimized delay value with the original delay value;
    saving the timing optimized gate configuration net-lists and the timing optimized gate configuration delays in the result database;
    replacing the original gate with the timing optimized gate configuration in the result database; and
    initiate the process for another original gate.

5. The method of claim 1, wherein the delay characterization database comprises information on the ideal delay value, a signal rise time, and a signal fall time for at least one of the ideal gate configuration.

6. The method of claim 1, wherein at least one of the ideal gate configuration comprises a net-list with and without all available buffer combinations.

7. The method of claim 1, wherein at least one of the ideal gate configuration comprises a net-list with and without all available inverter combinations.

8. The method of claim 1, wherein retrieving the integrated circuit design net-list comprises of at least two or more gates.

9. The method of claim 1, wherein performing incremental static timing analysis of gate configurations comprises inputting:
    the ideal gate delay,
    a signal rise time,
    a signal fall time, and
    the associated ideal gate configuration net-list from the delay characterization database.

10. The method of claim 9, wherein the associated ideal gate configuration net-list from the delay characterization database occurs without generation of a new net-list for each such gate configuration input at each iteration.

11. A non-transitory computer readable recording medium storing thereon a program causing a computer to execute a timing optimization of an integrated circuit design using a timing optimization system, comprising:
    loading an original delay value and an original gate configuration net-list for an original gate from the results database;
    identifying a virtually optimized ideal gate configuration using an ideal gate configuration information stored in a delay characterization database for the original gate;
    loading an ideal delay value and an ideal gate configuration net-list of an ideal gate configuration; and
    producing a timing optimized gate configuration from running an incremental static timing analysis on the loaded gate configuration.

12. The non-transitory computer readable recording medium of claim 11, wherein the delay characterization database is generated by:
    defining and identifying gates,
    saving the identified gates in a local storage,
    loading a gate from the plurality of identified gates,
    running a timing simulation to characterize a delay value for the gate with a minimum load, extracting an ideal delay value and an ideal rise and an ideal fall time, saving the extracted ideal gate configuration in the delay characterization database, and loading another gate from the plurality of identified gates and repeating the process.

13. The non-transitory computer readable recording medium of claim 11, wherein prior to loading the original gate, comprising:

retrieving the delay characterization database for a gate library in a process technology node;

retrieving an integrated circuit design net-list;

running a static timing analysis of the integrated circuit design net-list;

extracting the original delay value for at least one gate configuration from the result of the static timing analysis of the integrated circuit design net-list; and storing the original delay value, the original gate load information, and the original gate configuration net-list in the results database for the at least one gate.

14. The non-transitory computer readable recording medium of claim 11, wherein after producing the timing optimized gate configuration, comprising:

calculating the resultant timing optimized delay value for the timing optimized gate configuration;

comparing the timing optimized delay value with the original delay value;

saving the timing optimized gate configuration net-lists and the timing optimized gate configuration delays in the result database;

replacing the original gate with the timing optimized gate configuration in the result database; and initiate process for another original gate.

15. The non-transitory computer readable recording medium of claim 11, wherein the delay characterization database comprises information on the ideal gate configuration delay, a signal rise time, and a signal fall time for at least one of the ideal gate configuration.

16. The non-transitory computer readable recording medium of claim 11, wherein at least one of the ideal gate configuration comprises a net-list with and without all available buffer combinations.

17. The non-transitory computer readable recording medium of claim 11, wherein at least one of the ideal gate configuration comprises a net-list with and without all available inverter combinations.

18. The non-transitory computer readable recording medium of claim 11, wherein retrieving the integrated circuit design net-list comprises of at least two or more gates.

19. The non-transitory computer readable recording medium of claim 11, wherein performing incremental static timing analysis of gate configurations comprises inputting:

the ideal gate delay, a signal rise time, a signal fall time, and the associated ideal gate configuration net-list from the delay characterization database.

20. The non-transitory computer readable recording medium of claim 19, wherein the associated ideal gate configuration net-list from the delay characterization database occurs without generation of a new net-list for each such gate configuration input at each iteration.

* * * * *